United States Patent
Yang

(10) Patent No.: US 10,468,545 B1
(45) Date of Patent: Nov. 5, 2019

(54) AIRFOIL BODY INCLUDING A MOVEABLE SECTION OF AN OUTER SURFACE CARRYING AN ARRAY OF TRANSDUCER ELEMENTS

(71) Applicant: SolAero Technologies Corp., Albuquerque, NM (US)

(72) Inventor: Lei Yang, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 384 days.

(21) Appl. No.: 15/445,301

(22) Filed: Feb. 28, 2017

(51) Int. Cl.
| | |
|---|---|
| H01L 31/0445 | (2014.01) |
| B64C 3/26 | (2006.01) |
| B64C 3/48 | (2006.01) |
| B64D 27/24 | (2006.01) |
| B64C 39/02 | (2006.01) |
| H02S 30/20 | (2014.01) |
| H02S 20/00 | (2014.01) |

(52) U.S. Cl.
CPC ............ *H01L 31/0445* (2014.12); *B64C 3/26* (2013.01); *B64C 3/48* (2013.01); *B64C 39/024* (2013.01); *B64D 27/24* (2013.01); *H02S 30/20* (2014.12); *B64C 2201/021* (2013.01); *B64C 2201/042* (2013.01); *B64C 2201/066* (2013.01); *B64C 2201/104* (2013.01); *B64D 2211/00* (2013.01); *H02S 20/00* (2013.01)

(58) Field of Classification Search
CPC .... B64C 3/26; B64C 3/38; B64C 3/48; B64C 3/52; B64C 2003/445; B64C 23/02; B64D 15/16
See application file for complete search history.

(56) References Cited

U.S. PATENT DOCUMENTS

| | | | | |
|---|---|---|---|---|
| 1,567,531 A | * | 12/1925 | Magni | B64C 3/48 |
| | | | | 244/215 |
| 1,785,300 A | * | 12/1930 | De La Tour Castelcicala | ............ |
| | | | | B64C 23/08 |
| | | | | 244/200 |
| 2,028,669 A | * | 1/1936 | Hiscock | B64D 15/16 |
| | | | | 244/134 A |
| 2,399,648 A | * | 5/1946 | Love | B64D 15/16 |
| | | | | 244/134 A |
| 2,471,894 A | * | 5/1949 | Pulver | B64D 15/16 |
| | | | | 244/134 A |
| 4,432,516 A | * | 2/1984 | Muscatell | B64C 3/48 |
| | | | | 244/113 |

(Continued)

OTHER PUBLICATIONS

Walmsley, Nicholas, Wrosch, Matthew, and Stern, Theodore. "Low cost automated manufacture of high specific power photovoltaic solar arrays for space." Photovoltaic Specialist Conference (PVSC), 2014 IEEE 40th. IEEE, 2014.

*Primary Examiner* — Joseph W Sanderson

(57) ABSTRACT

An airfoil body for an aircraft extending from an inner end to an outer end, between a leading edge and a trailing edge and having a pressure surface and a suction surface, the airfoil body having an outer surface and an inner support structure, the outer surface including a fixed skin section and a movable skin section, wherein the movable skin section comprises a first portion including an array of transducer elements, and the airfoil body including an actuator for moving the movable skin section to selectively position the transducer elements on the outer surface.

18 Claims, 12 Drawing Sheets

(56) References Cited

U.S. PATENT DOCUMENTS

| | | | | |
|---|---|---|---|---|
| 5,590,854 | A * | 1/1997 | Shatz | B64C 1/12 244/130 |
| 7,178,760 | B2 * | 2/2007 | Bernard | B64D 15/16 244/134 A |
| 7,451,948 | B2 * | 11/2008 | Al-Qutub | B64D 15/16 244/134 R |
| 8,418,967 | B2 * | 4/2013 | Hemmelgam | B64C 3/48 244/219 |
| 9,061,752 | B2 * | 6/2015 | Nagel | B64C 3/48 |
| 9,856,013 | B2 * | 1/2018 | Paris Carballo | B64C 3/48 |
| 2005/0230036 | A1 | 10/2005 | Lampl | |
| 2007/0262202 | A1 * | 11/2007 | Al-Qutub | B64D 15/16 244/134 A |
| 2009/0308124 | A1 | 12/2009 | Iannucci | |
| 2013/0099050 | A1 | 4/2013 | Sanderson et al. | |
| 2013/0233976 | A1 * | 9/2013 | Nagel | B64C 3/48 244/201 |
| 2015/0298792 | A1 * | 10/2015 | Paris Carballo | B64C 3/48 244/45 R |
| 2015/0357501 | A1 | 12/2015 | Derkacs et al. | |
| 2016/0167764 | A1 | 6/2016 | Grip et al. | |
| 2016/0194072 | A1 | 7/2016 | Cornew et al. | |
| 2017/0175705 | A1 * | 6/2017 | Garver | B64C 3/38 |

\* cited by examiner

AIRFOIL BODY INCLUDING A MOVEABLE SECTION OF AN OUTER SURFACE CARRYING AN ARRAY OF TRANSDUCER ELEMENTS

TECHNICAL FIELD

The present invention relates generally to an airfoil body for an aircraft. More particularly, the present invention relates to airfoil bodies comprising transducer elements, and in particular an array of solar cells. Furthermore, the present invention relates to a wing section or wing for a manned or unmanned aerial vehicle (UAV).

BACKGROUND

Aircraft that have arrays of photovoltaic solar cells on the aircraft's wings for converting solar energy into electrical power are known. The electrical power generated by such solar cells may be used to operate on-board aircraft systems and/or to propel the aircraft, typically using one or more electric motors and propellers. The solar arrays are typically mounted on a suction surface (upper surface) of the wings since such location provides favorable exposure to sunlight.

Designing solar powered aircraft, particularly those flying at high altitudes, has several challenges. The surface area of photovoltaic cells needed to provide sufficient electrical power for propelling an aircraft may be significant. If the photovoltaic cells are to provide all or a significant part of the power needed for propelling the aircraft, a large wingspan is needed. At the same time, the weight of the (wing) structure needs to be controlled resulting in the use of light materials and structures. However, long, lightweight wings may be highly flexible, presenting a number of problems for the photovoltaic cells due to the loads imposed on the wings during flight. As noted in US Patent Application Publication 20160167764, the flexing of the wings during flight may cause the solar panels to experience high strains that can adversely affect the integrity of the solar panels. These strains may also result in buckling or wrinkling of the solar panels which may trip the airflow boundary layer over the wings from laminar to turbulent, or cause air flow separation, which may significantly reduce the aerodynamic performance of the aircraft.

The integrity of the solar panels and/or the aerodynamic performance of the wings may also be adversely affected by large temperature swings experienced by the aircraft during flight. These temperature swings may result in excessive stresses and strains between the solar panel and the wing structure, due to differences in thermal expansion.

It is an object of the present invention to provide an airfoil body that least partially resolves some of the aforementioned problems.

SUMMARY OF THE INVENTION

In a first aspect, the present invention provides an airfoil body for an aircraft extending from an inner end to an outer end, between a leading edge and a trailing edge and having a pressure surface and a suction surface. The airfoil body having an outer surface and an inner support structure, the outer surface including a fixed skin section and a movable skin section, wherein the movable skin section comprises a first portion including an array of transducer elements, and the airfoil body including an actuator for moving the movable skin section to selectively position the transducer elements on the outer surface.

In accordance with this aspect, an actuator can selectively position transducer elements on the suction surface of the airfoil body in accordance with circumstances. In a situation of higher loads, e.g. due to turbulence, or a maneuver of the aircraft the transducer elements may be removed from the wing surface so as to avoid damage. In another situation of e.g. lower loads, or less deflection of the wing, the relatively fragile transducer elements may be positioned on the surface of the wing.

In some embodiments, the first portion of the movable skin section may include a planar array of solar cells, and the movable skin section further comprises a second portion, the second portion being a smooth planar sheet.

In some embodiments, the airfoil body may comprise a first spindle and a second spindle arranged within the airfoil body, wherein the movable skin section is arranged to be selectively wound around the first spindle or the second spindle, and wherein the actuator includes a first drive for rotating the first spindle. Optionally, the actuator may further include a second drive for rotating the second spindle. By winding the movable skin on the first or second spindle, the portion of the movable skin that is exposed, i.e. positioned on the suction surface of the wing can be determined. Either both spindles may have active drives involving e.g. electric motors, or one of the spindles may have an active drive, whereas the other spindle can have a passive rewind system for rewinding a spindle if the other spindle is not being driven or controlled. Such a passive rewind system may include a spring mechanism.

In some embodiments, the fixed skin section may comprise a first slot and a second slot, and the movable skin section extends from the first spindle through the first slot and through the second slot to the second spindle, a portion of the movable skin section being positioned on top of the fixed skin section. In other embodiments, the movable skin section extends from the first spindle over the inner support structure to the second spindle.

In some embodiments, a length of the first portion of the movable skin section may be at least 20%, preferably at least 40% or 50% of a chord line of the airfoil body. Similarly, the length of a second portion may be at least 20%, preferably at least 40% or 50% of the chord line of the airfoil body.

In some embodiments the array of transducer devices comprises one or more of: (i) an array of photovoltaic devices; (ii) an array of semiconductor sensors; (iii) an antenna array; (iv) piezoelectric transducers and/or (v) thermal transfer elements.

In some embodiments, the movable skin section may include a fiber reinforced supporting member. A fiber reinforced composite may be used for the skin of the airfoil body. The fibers may include e.g. glass fibers, carbon fibers, Kevlar® fibers or combinations of these.

In a further aspect, an aircraft including an airfoil body as hereinbefore described is provided. The airfoil body may form a complete wing of the aircraft, or a wing segment of the aircraft. The aircraft may be a manned aircraft or an unmanned aerial vehicle (UAV).

In a further aspect, the present invention provides a method of operating a wing for an aircraft comprising an airfoil body extending from an inner end to an outer end, between a leading edge and a trailing edge and having a pressure surface and a suction surface; the airfoil body having an outer skin and an inner support structure, the outer skin including a fixed skin section and a movable skin section. The movable skin section includes a flexible supporting member that includes a first surface element along a first portion of the supporting member, and a second surface element different from the first surface element longitudinally arranged along a second portion of the supporting member. The method comprises positioning the first surface element on the suction surface during first flight conditions, and positioning the second surface element during second flight conditions.

In accordance with this aspect, a wing of an aircraft can be operated more efficiently. Depending on the flight conditions, a first surface element or a second surface element may be positioned on the suction surface of the wing. The different surface elements may be designed or optimized for different flight conditions. For example, a smooth surface element may be particularly useful for more critical aerodynamic or operational conditions. On the other hand, a surface element that can be aerodynamically less optimal can be used in relatively smooth weather conditions. Such a surface element might have further capabilities, such as e.g. solar energy conversion, load sensing, reception or transmission of signals, or deformability.

In some embodiments, the first surface element may be positioned on the suction surface during smooth flight conditions. In some embodiments, the second surface element may be positioned on the suction surface during turbulent flight conditions or during takeoff and landing of the aircraft. Certain maneuvers in flight, such as sharp turns can lead to predictable high loads. Before such a maneuver, the transducer elements might be stowed inside the airfoil body, instead of on the wing surface. Other examples of predictable high loads are takeoff and landing.

In some embodiments, the method may comprise determining loads on the airfoil body to determine flight conditions. Determining loads may be done using e.g. strain gauges or accelerometers. These sensors may be placed in suitable positions on the wings, e.g. on the wing surface.

In yet a further aspect, the present invention provides an airfoil body for an aircraft extending from an inner end to an outer end, between a leading edge and a trailing edge and having a pressure surface and a suction surface, the airfoil body having an outer skin and an inner support structure. The airfoil body further comprising a first spindle and a second spindle arranged within the airfoil body, and a flexible support member extending between the first spindle and the second spindle and being arranged to be wound on the first spindle or the second spindle. The flexible support member carries an array of transducers along a portion of the flexible support member, and a drive for rotating the first spindle and/or the second spindle to selectively position the array of transducers between the first and the second spindle.

According to this aspect, the transducers may be selectively exposed or stowed on one of the spindles. In some examples, the flexible support may extend between the first spindle and the second spindle and over a portion of the suction surface. The transducers, e.g. solar cells can thus be positioned on an outer surface of a wing. In other examples, the flexible support member may extend between the first and the second spindle inside the airfoil body. The skin of the airfoil body may be made translucent or transparent. Solar cells may be arranged on the flexible support member inside the airfoil body and provide power. In the case of higher (predicted) loads, or in the case of (predicted) deflection or deformation of the wing above a predetermined threshold, the solar cells may be stowed on one of the spindles. It can thus be avoided that the solar cells become damaged.

In another aspect, the present disclosure provides an airfoil wing skin comprising: a first film composed of ethylene tetrafluoroethylene (ETFE); a second film composed of a non-crosslinked silicone pressure sensitive adhesive mounted directly over the ETFE film; an array of interconnected transducers mounted directly over the second film; a third uncured supporting film composed of a composite material mounted directly on the array of transducers.

In another aspect, the present disclosure provides a wing airfoil for an aircraft or UAV comprising an airfoil body having a frame that extends at least between leading and trailing edges, first and second sides, and radially inner and outer ends; a flexible supporting member disposed within the airfoil body that includes a first surface element longitudinally arranged along the upper surface of a first portion of the supporting member and having a length more than 40% of the length between the leading and trailing edges of the body and a second surface element different from the first element and longitudinally arranged along a second portion of the supporting member and having a length more than 40% of the length between the leading and trailing edges of the body; and a first and second mandrel disposed within the airfoil body on which the flexible supporting member may be wound to allow deployment of the array when actuated to a first deployed position in which the first surface element forms or extends along the upper skin of the airfoil.

In some embodiments, the flexible supporting member may be wound to allow deployment of the array when actuated to a second deployed position in which the second surface element forms or extends along the upper skin of the airfoil.

In some embodiments, the flexible supporting member may be wound to allow deployment of the array when actuated to a third deployed position in which a portion of both the first and the second surface element forms or extends along the upper skin of the airfoil.

In some embodiments, the solar cells have electrical contacts of positive and negative polarity on the backsides of the solar cells, and have a thickness of less than 0.03 inches.

In some embodiments, the movable skin section comprises film composed of ethylene tetrafluoroethylene (ETFE); a film composed of a non-crosslinked silicone pressure sensitive adhesive mounted over the ETFE film; an array of transducers mounted directly over the adhesive film; and a bottom supporting film mounted directly on the array of transducers.

In some embodiments, the first surface element includes an array of transducers to provide an adaptable airfoil cross-sectional shape or surface profile to adapt the exterior wing surface and shape to the aircraft speed.

In some embodiments, a plurality of solar cells are disposed closely adjacent to one another on each of the strips by a distance between 5 and 25 microns.

In some embodiments, each of the solar cells are rectangular or square and have a dimension in the range of 0.5 to 10 mm on a side.

In some embodiments of the disclosure, the flexible support member may include a polyimide film layer such as KAPTON. KAPTON® is a trademark of E.I. du Pont de Nemours and Company. The chemical name for KAPTON® is poly (4, 4'-oxydiphenylene-pyromellitimide). Other polyimide film sheets or layers may be used.

In some embodiments of the disclosure, a polyimide film layer with conductive traces on which the solar cells are mounted directly or solely through a conductive bonding material layer.

In some embodiments of the disclosure, the conductive traces establish serial interconnections between the solar cells.

In some embodiments, the support has a thickness of between 25 and 100 microns, or between 1 mil (25.4 μm) and 4 mil (101.6 μm).

In another aspect, the present disclosure provides a wing airfoil for an aircraft or UAV comprising an airfoil body having a frame that extends at least between leading and trailing edges, first and second sides, and radially inner and outer ends; a flexible supporting member that includes a first surface element having a first predetermined length extending between the leading and trailing edges of the body and a second surface element different from the first element having a second predetermined length and longitudinally arranged along a second portion of the supporting member; and a first and second mandrel disposed within the airfoil body at the leading and trailing edges of the body respectively and on which the flexible supporting member may be wound to allow positioning of the flexible supporting member with the first surface element forming the surface for a first actuated position, and the second surface element forming the surface of the wing airfoil for a second actuated position.

In another aspect, the present disclosure provides a method of operating a wing airfoil for an aircraft or UAV comprising an airfoil body having a frame that extends at least between leading and trailing edges, first and second sides, and radially inner and outer ends; a flexible supporting member that includes a first surface element having a first predetermined length extending between the leading and trailing edges of the body and a second surface element different from the first element having a second predetermined length and longitudinally arranged along a second portion of the supporting member, the method comprising actuating the deployment of the flexible supporting member to a first position during first flight conditions, and to a second position during second flight conditions.

In another aspect, the present disclosure provides an aircraft or UAV and its method of operation comprising: providing a wing airfoil for an aircraft or UAV comprising an airfoil body having a frame that extends at least between leading and trailing edges, first and second sides, and radially inner and outer ends; a flexible supporting member that includes a first surface element having a first predetermined length extending between the leading and trailing edges of the body and a second surface element different from the first element having a second predetermined length and longitudinally arranged along a second portion of the supporting member; providing a first and second mandrel disposed within the airfoil body at the leading and trailing edges of the body respectively and on which the flexible supporting member may be wound and unwound to allow positioning of the flexible supporting member with the first surface element forming the surface of the wing airfoil during a first actuated position, and the second surface element forming the surface of the wing airfoil during a second actuated position.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DETAILED DESCRIPTION

Figure 1:
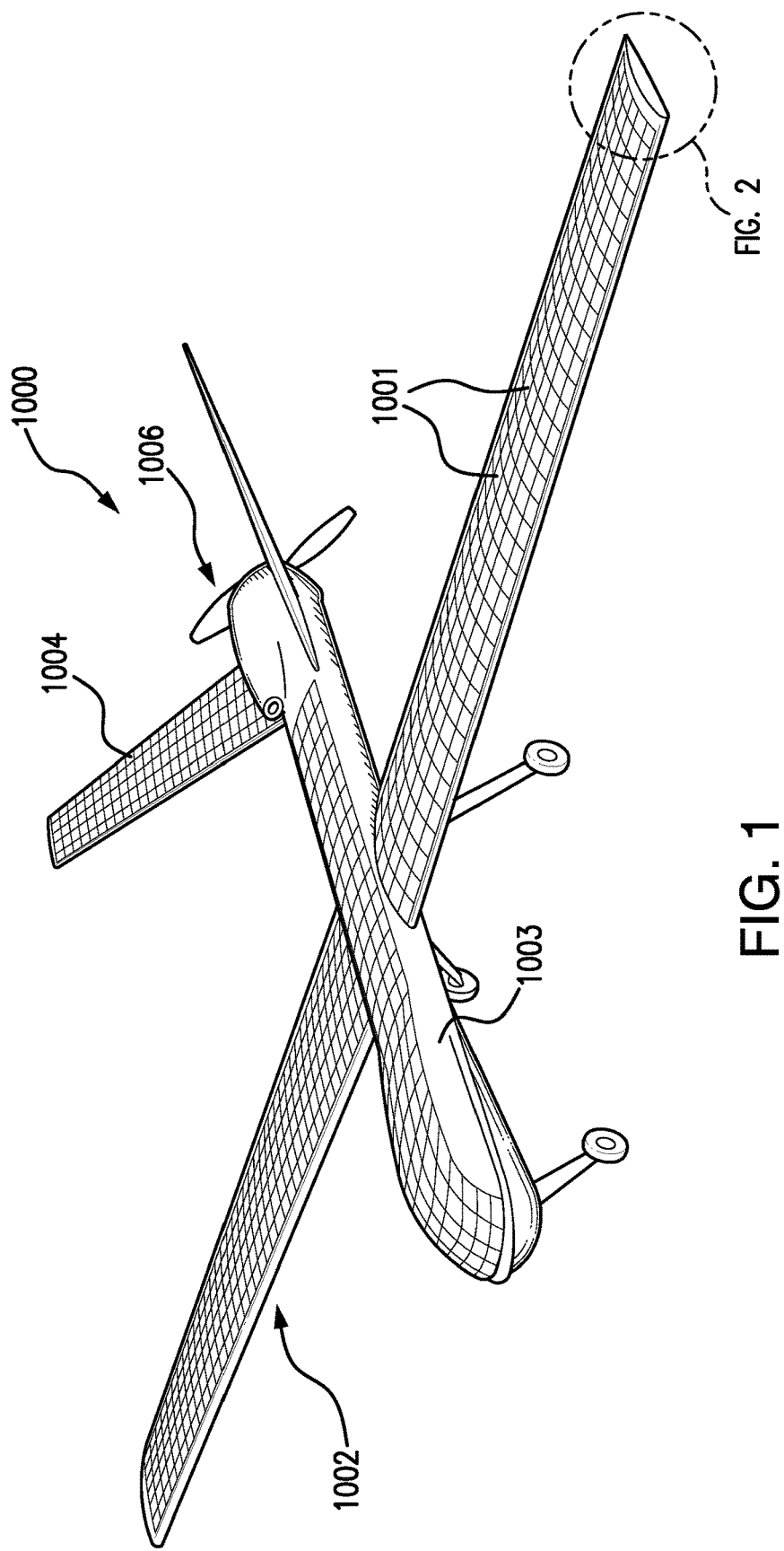
FIG. 1 is a perspective view of an exemplary embodiment of an aircraft having a solar cell assembly attached to different, non-planar surfaces of the aircraft including a wing.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1 is a perspective view of an aircraft 1000 having a solar cell assembly 1001 positioned on a suction surface of the wings 1002 of the aircraft 1000. The aircraft 1000 in this example is an unmanned aerial vehicle (UAV). Such a UAV may be used e.g. in surveillance missions.

In the example of FIG. 1, solar cells are not only provided on the wings 1002, but also on a top surface of a fuselage 1003, and on the suction surfaces of the horizontal tail surfaces 1004. Part or all of the electrical power generated by the solar cell assembly may be provided to a propulsion assembly 1006 for propelling the UAV. The propulsion assembly may include one or more electric motors and one or more propellers.

Although a UAV is depicted in FIG. 1, it is clear that the examples according to the present disclosure may be used in different types of aircraft. In some embodiments, at least part of the electrical power generated by the solar cell assembly is directed to auxiliary systems on the aircraft. Such auxiliary systems may include e.g. navigational systems, or flap or slat deployment and retraction mechanisms.

Similarly, although one embodiment discussed in the present disclosure is an airfoil wing, other structural components of an aircraft or UAV may incorporate the features of the present disclosure, as well as booms or tethered assemblies extending from the body of the aircraft or UAV.

Figure 2A:
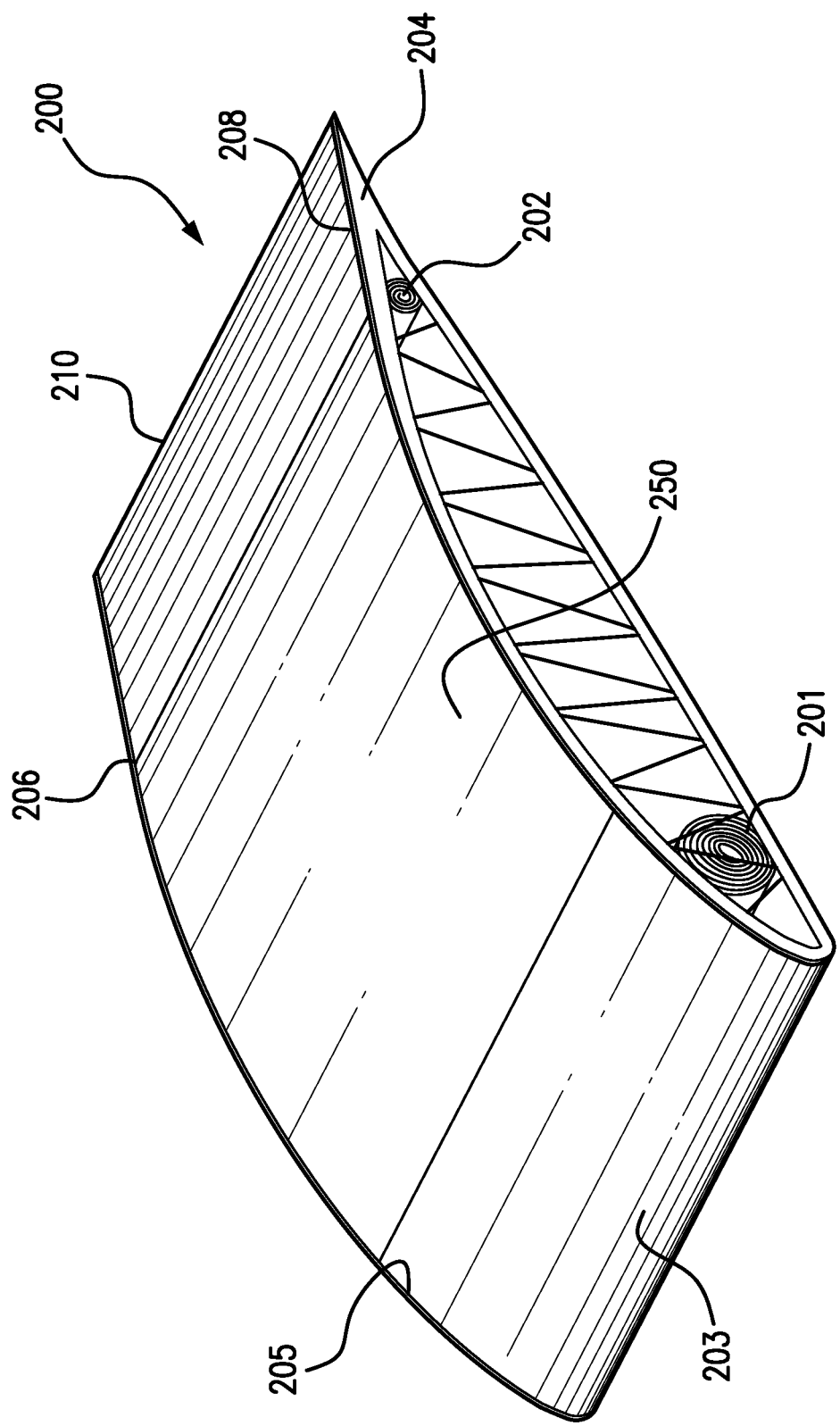
FIG. 2A is a perspective view of an exemplary embodiment of a wing segment according to the present disclosure.

FIG. 2A is a perspective view of a portion of an example of an airfoil body 200 according to the present disclosure. The airfoil body extends from a leading edge 203 to a leading edge 210 and from an inner side 206 to an outer side 208. In this sense, the inner side may be or may be closer to a root of a wing that includes the airfoil body. The outer side may be or may be closer to a tip of wing. The airfoil body 200 comprises an inner support structure. Such an inner support structure may include ribs 205, 206 and may include one or more spars, or a box spar extending along the length of a wing.

The airfoil body includes a wing surface forming the outer surface of the airfoil body which is supported by the inner support structure. In FIG. 2A, the outer surface includes a movable skin section 250.

Figure 2B:
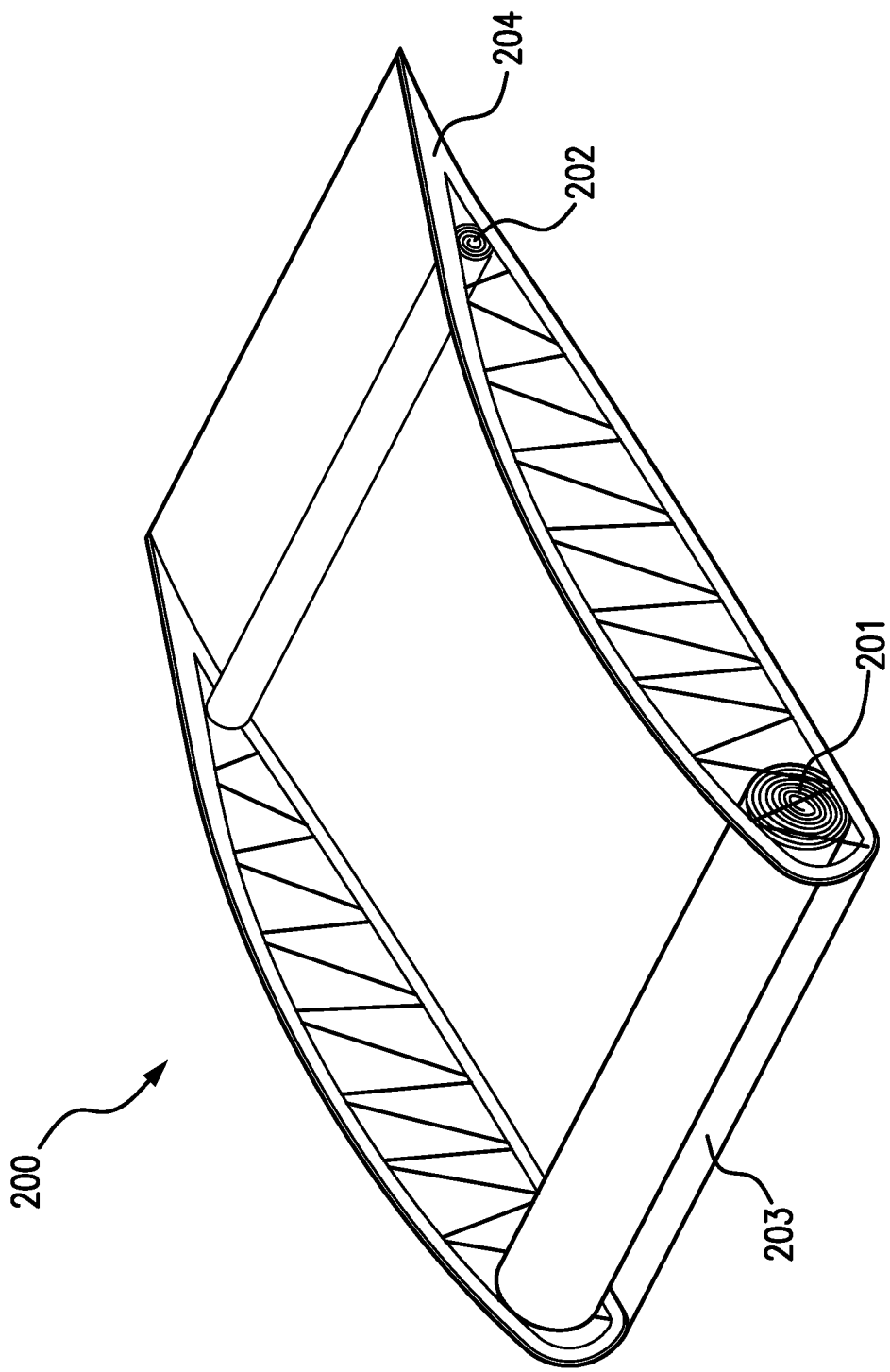
FIG. 2B is a perspective view of an exemplary embodiment of a wing segment according to the present disclosure illustrating a first spindle disposed in the region of the leading edge on which a flexible airfoil skin is wound and a second spindle disposed in the region of the trailing edge on which the other end of the flexible airfoil skin is wound.

FIG. 2B is a perspective cut-away view the airfoil body of FIG. 2A. The movable skin section 250 may include a flexible sheet or supporting member that can be wound on a first spindle 201 or a second spindle. In this embodiment, the first spindle 201 is located close to the leading edge, whereas the second spindle 202 is located closer to the trailing edge. By winding the flexible support member more on the first spindle 201 or more on the second spindle 202, the portion of the movable skin section that is exposed may be determined and changed.

The movable skin section 250 may include a plurality of transducer elements along a first portion of the flexible support member. Along a second portion of the flexible support member, no transducer elements are provided. By winding the flexible support member more on the first spindle 201 or more on the second spindle 202, the portion of the movable skin section that is exposed may be determined and changed.

In some situations, in a first position of the movable skin section, the suction surface may comprise transducer elements along substantially the whole length and width of the movable skin section forming the suction surface. In a different situation, the movable skin section may be positioned such that only a smooth planar sheet forms the suction surface. In yet a further situation, the flexible supporting member may be wound to allow partial deployment of the array when actuated to a third deployed position: the suction surface formed by the movable skin section includes both the first and the second surface elements. In other words, a portion of the movable skin section that is exposed includes transducer elements, whereas another portion does not.

To this end, the first spindle 201 may include a first spindle drive and the second spindle 202 may include a second spindle drive. See FIG. 2C. In accordance with circumstances, e.g., flight conditions, the portion of the moveable skin section 250 that carries transducer elements (which may be relatively fragile) may be positioned on the suction surface of the airfoil body.

The length of the portion of the flexible support member may be at least 40% or 50% of the length of the (local) chord of the airfoil body. Similarly, the length of the portion of the flexible support member may be at least 40% or 50% of the length of the (local) chord of the airfoil body. Thus, the movable skin section positioned on the wing surface may extend along at least 40% or 50% of the length of the (local) chord of the airfoil body.

In some examples, the transducer elements may be solar cells. The electrical power generated by the solar cells may be used e.g. for propulsion of an aircraft. In some examples, the transducer elements may include an array of semiconductor sensors. These sensors may be used for determining loads. In some examples, the transducer elements may include an antenna array for receiving and sending signals to a central control unit. Such a central control unit may be located inside the aircraft or at a remote location. In some examples, the transducer elements may include piezoelectric transducers for deforming and changing a surface of the airfoil body in response to control signals. In some examples, the transducer elements may include thermal transfer elements. Thermal loads may cause damage to e.g. solar cells. Thermal transfer elements may be provided with a goal to reduce thermal loads.

In some embodiments, various of these examples of transducer elements may be combined. For example, in some embodiments, the transducer elements may include an array of solar cells, and sensors and optionally antennas.

Figure 2C:
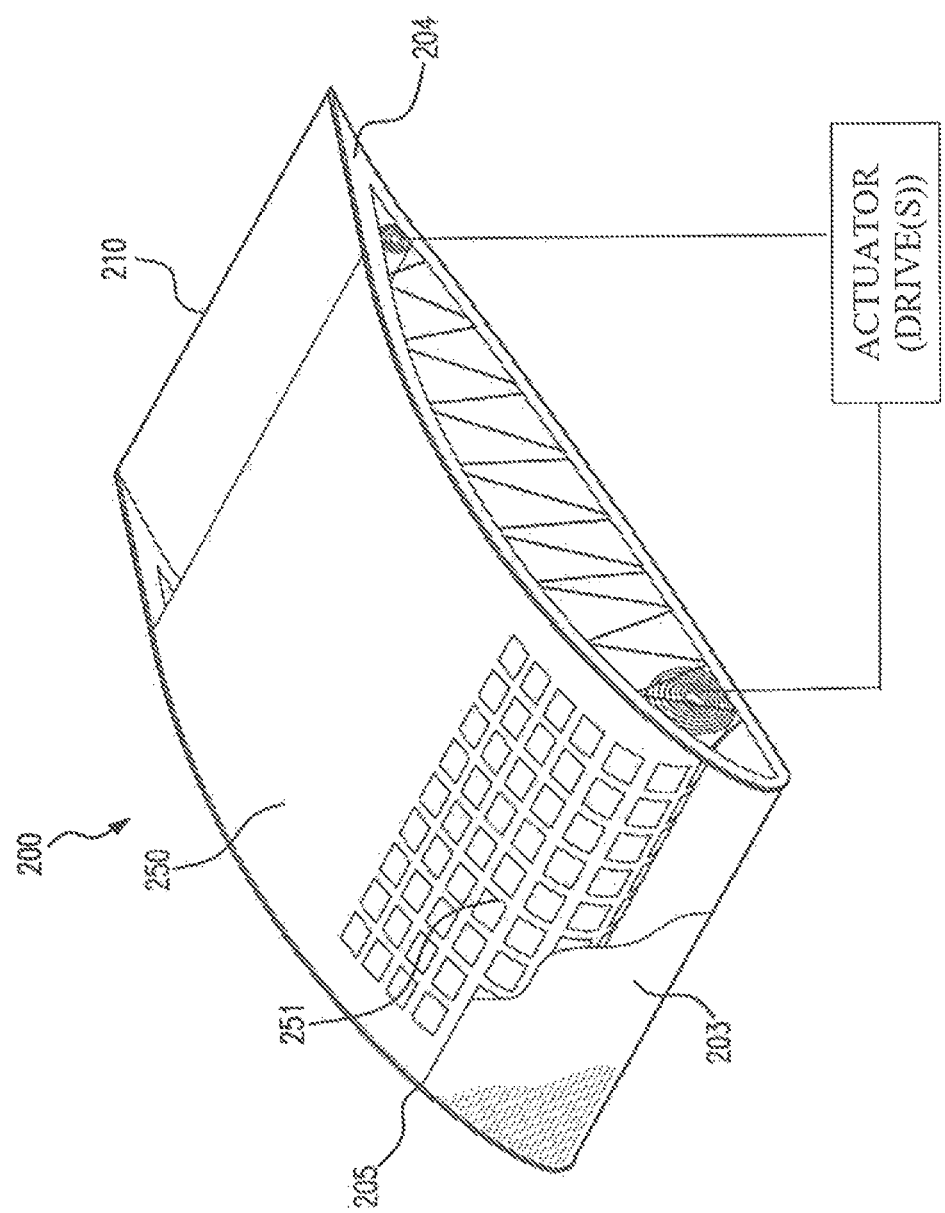
FIG. 2C is a perspective view of an exemplary embodiment of a wing segment according to the present disclosure illustrating a first spindle disposed in the region of the leading edge on which a flexible airfoil skin is wound and a second spindle disposed in the region of the trailing edge on which the other end of the flexible airfoil skin is wound.

FIG. 2C is a perspective cut-away view of a further example of an airfoil body. In this example, the skin of the (suction surface of) the wing may be translucent or transparent. A flexible support member 250 with transducer elements 251 may be arranged inside the airfoil body. In this case, the transducer elements preferably include solar cells. When the solar cells are deployed, light that passes through the wing skin may be converted into electricity. To this end, the solar cells might be arranged relatively close to the wing skin.

In case of higher loads, the solar cells may be stowed by winding the corresponding portion of the flexible support member on one of the spindles. Potential damage to the solar cells that might be caused by wrinkling of the wing skin may be avoided in this manner.

Figure 3A:
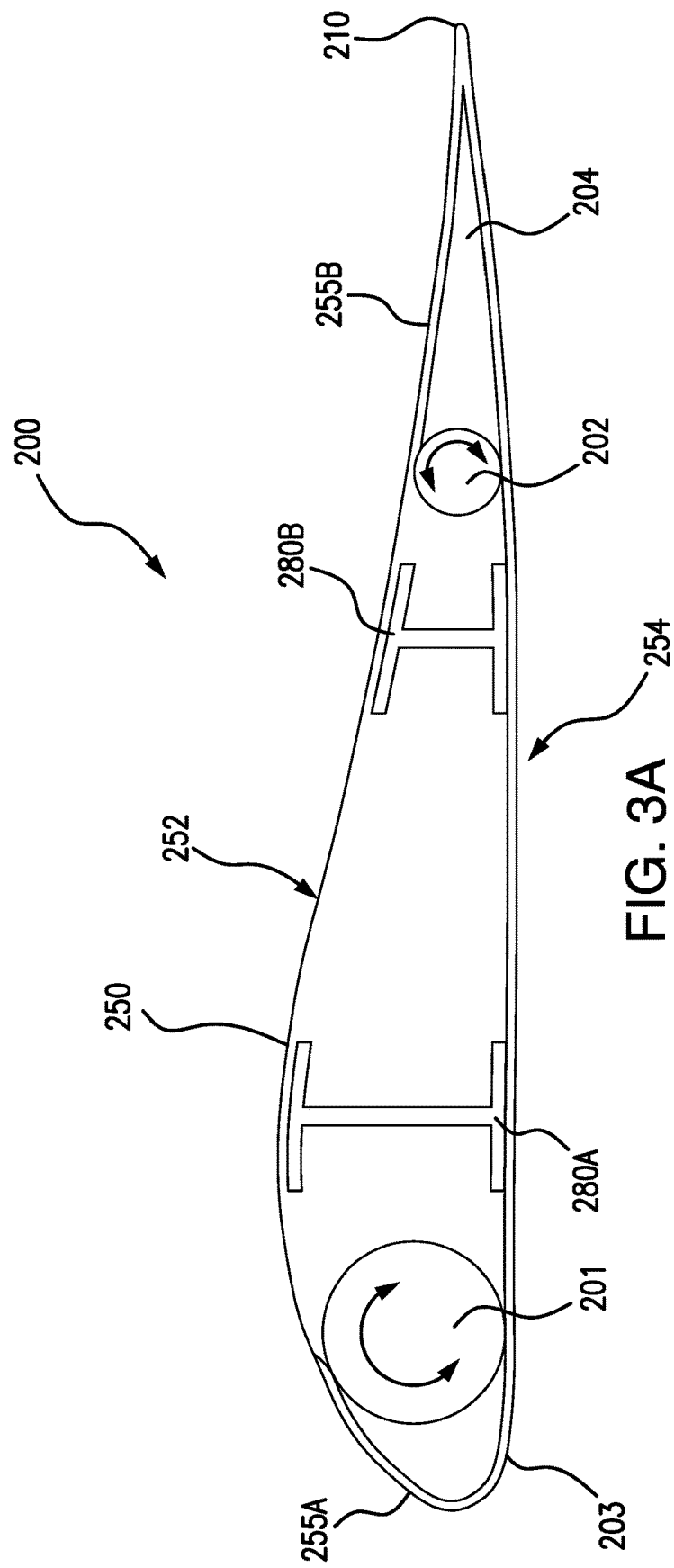
FIG. 3A is a cross-sectional view of an example of a wing segment.

FIG. 3A is a cross-sectional view of an example of a wing segment. The outer surface of the wing segment includes a pressure surface 254 and a suction surface 252. In the example of FIG. 3A, the suction surface 252 includes a fixed skin section 255A near a leading edge 203, and a fixed skin section 255B near a trailing edge 210.

The inner support structure according to the example of FIG. 3A includes front spar 280A and a rear 280B. In this example, the front and rear spars are formed by I-beams. The inner support structure may typically include a plurality of ribs 204 connected to the spars 280A and 280B and incorporating the airfoil shape of the wing segment. The movable skin section 250 extends from leading edge spindle 201 over the inner support structure to the trailing edge spindle 202.

Figure 3B:
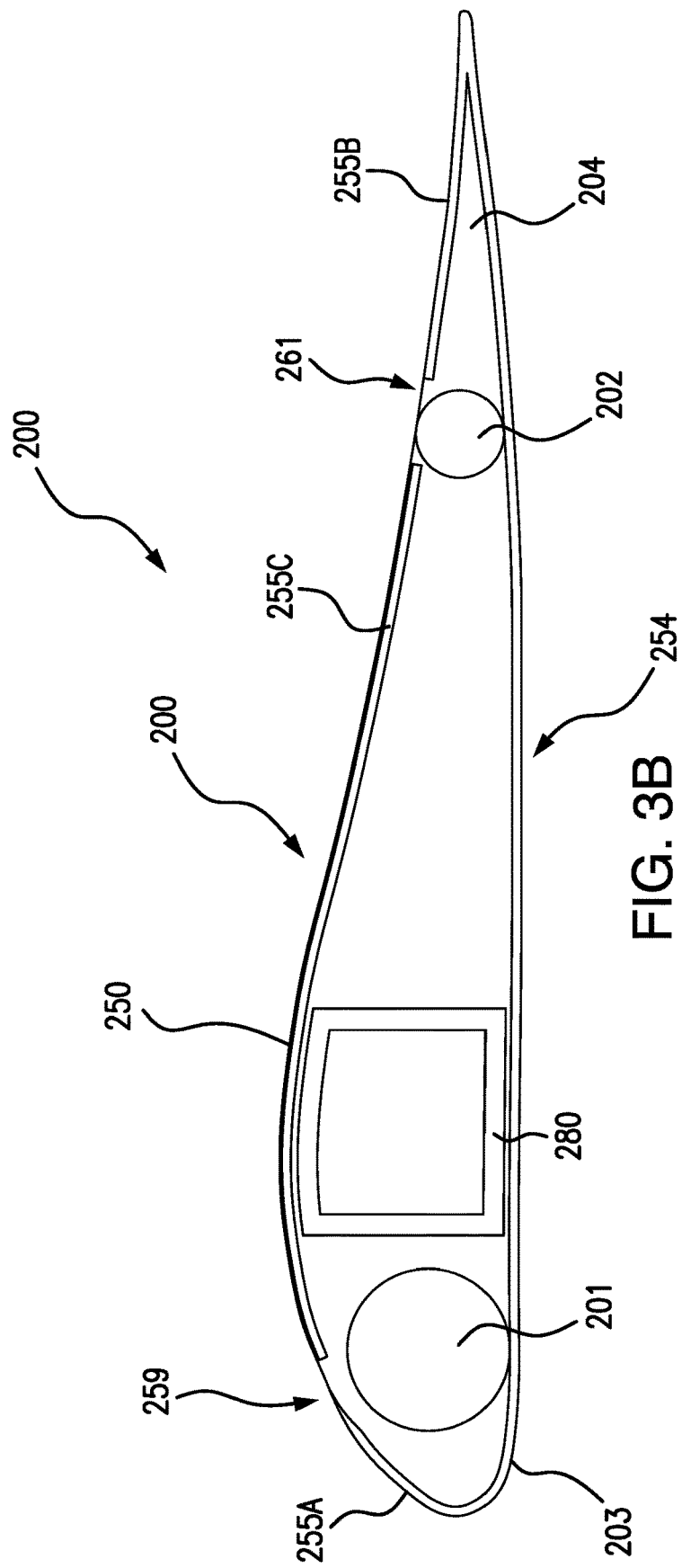
FIG. 3B is a cross-sectional view of another example of a wing segment.

FIG. 3B is a cross-sectional view of another example of a wing segment. Contrary to the example of FIG. 3A, the movable skin section 250 is supported by a fixed skin section 255C along the suction surface. The fixed skin of the suction surface comprises a leading edge slot 259 and a trailing edge slot 261. The movable skin section 250 extends from the leading edge spindle 201, through leading edge slot 259, over the fixed skin section 255c and through trailing edge slot 261 to the trailing edge spindle 202.

In FIG. 3 B, the inner support structure includes a box spar 280.

Figure 4A:
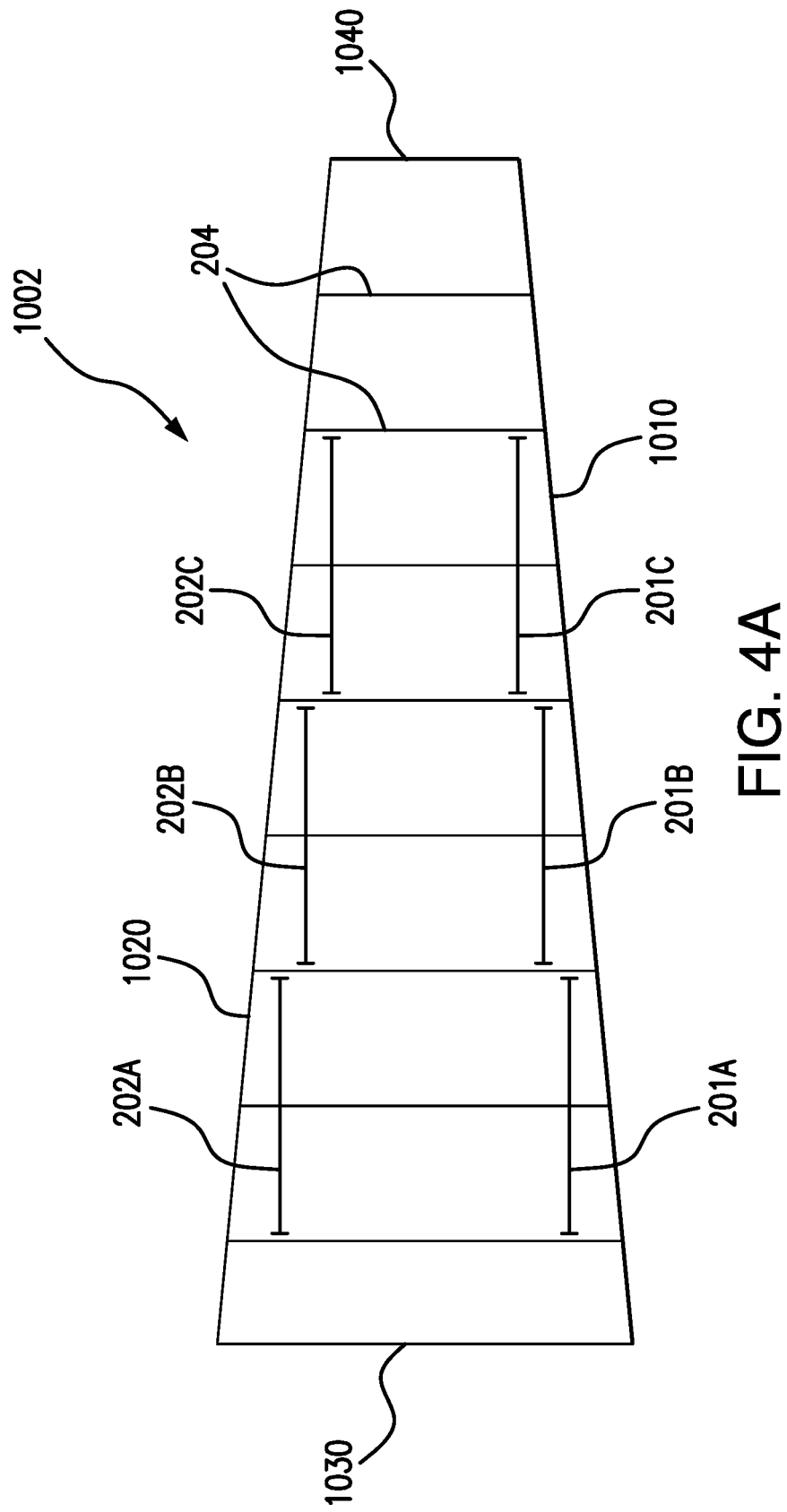
FIG. 4A is a top view of an example of a wing according to the present disclosure schematically illustrating a disposition of different spindles along the length of the wing.

FIG. 4A is a top view of an example of a wing according to the present disclosure illustrating a disposition of different spindles along the length of the wing. In the example of FIG. 4A, a wing 1002 extends from a root 1030 to a tip 1040 and from a leading edge 1010 to a trailing edge 1020. Schematically illustrated in FIG. 4A are a plurality of ribs 204.

In the depicted example, there are three pairs of spindles 201, 202 along the length of the wing: a pair of inboard spindles 201A and 202A, a pair of central spindles 201B, 201C and a pair of outboard spindles 201C and 202C. As illustrated schematically in FIG. 4A the spindles may have different lengths, and may have a length that is superior to a distance between ribs 204. It will be clear that in other examples, more pairs of spindles or less pairs of spindles may be provided.

Figure 4B:
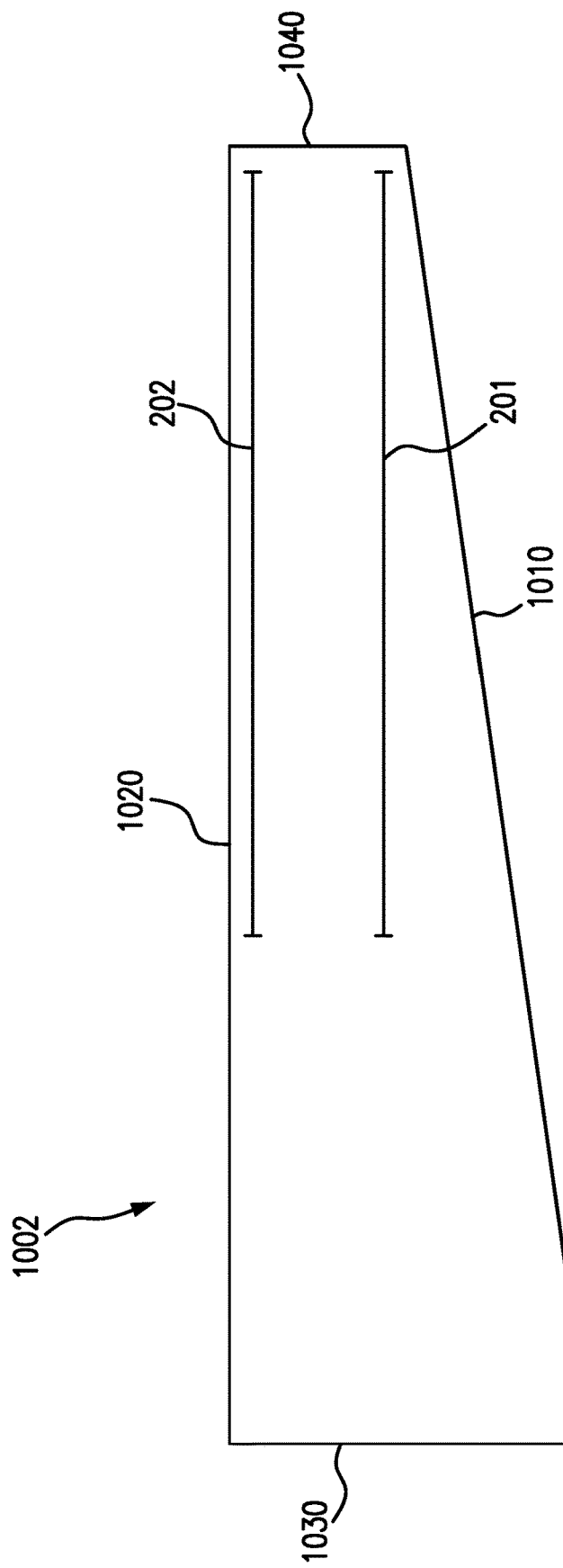
FIG. 4B is a top view of a different example of a wing according to the present disclosure schematically illustrating a different disposition of spindles along the length of the wing.

FIG. 4B is a top view of a different example of a wing according to the present disclosure illustrating a different disposition of spindles along the length of the wing. The wing 1002 extends from a root 1030 to a tip 1040 and from a leading edge 1010 to a trailing edge 1020. In the example of FIG. 4B a single pair of spindles 201, 202 is provided along an outer section of the wing. In this example, the inboard section of the wing does not include spindles or a movable skin section.

The inboard section of the wing, e.g. the inner 25%, 30%, 40% or 50% of the wing may generally be stiffer and stronger than the outboard section of the wing. At the inboard section, the chord length is generally higher than for an outboard section. Also the thickness of the airfoil body (i.e. the height of the airfoil body) at an inboard section may be higher than at an outboard section.

The inboard section of the wing may thus be less flexible and less deformable. Transducer elements such as solar cells arranged on a suction surface of the inboard section of the wing are thus subjected to less movements or deformations than transducer elements arranged on an outboard section of the wing. In some examples, the movable skin section and accompanying actuation mechanism which can selectively position transducer elements on the wing surface, are only provided along an outboard section of the wing, substantially covering e.g. the outer 25%, 30%, 40% or 50% of the length of the wing.

Figure 4C:
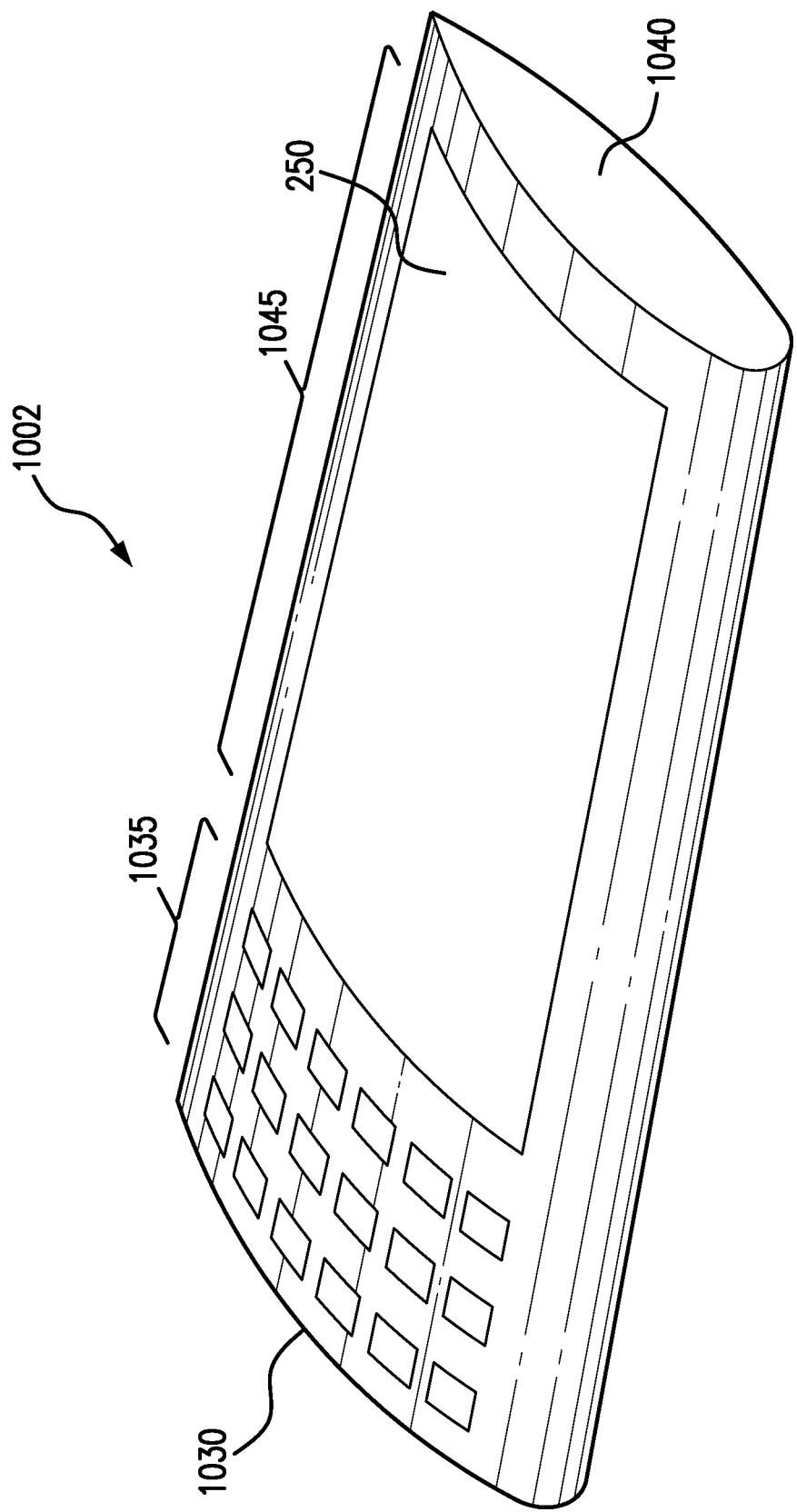
FIG. 4C is a schematic perspective view of a further example of a wing according to the present disclosure.

FIG. 4C is a schematic perspective view of a further example of a wing according to the present disclosure. In FIG. 4C, a situation is depicted in which an inboard section 1035 of the wing 1002 includes only a fixed skin section carrying transducer elements, e.g. an array of solar cells. The outboard section 1045 of the wing 1002 includes a movable skin section 250. In the situation of FIG. 4C, the movable skin section 250 is positioned such that the section forming the suction surface does not carry any transducer elements.

Figure 5:
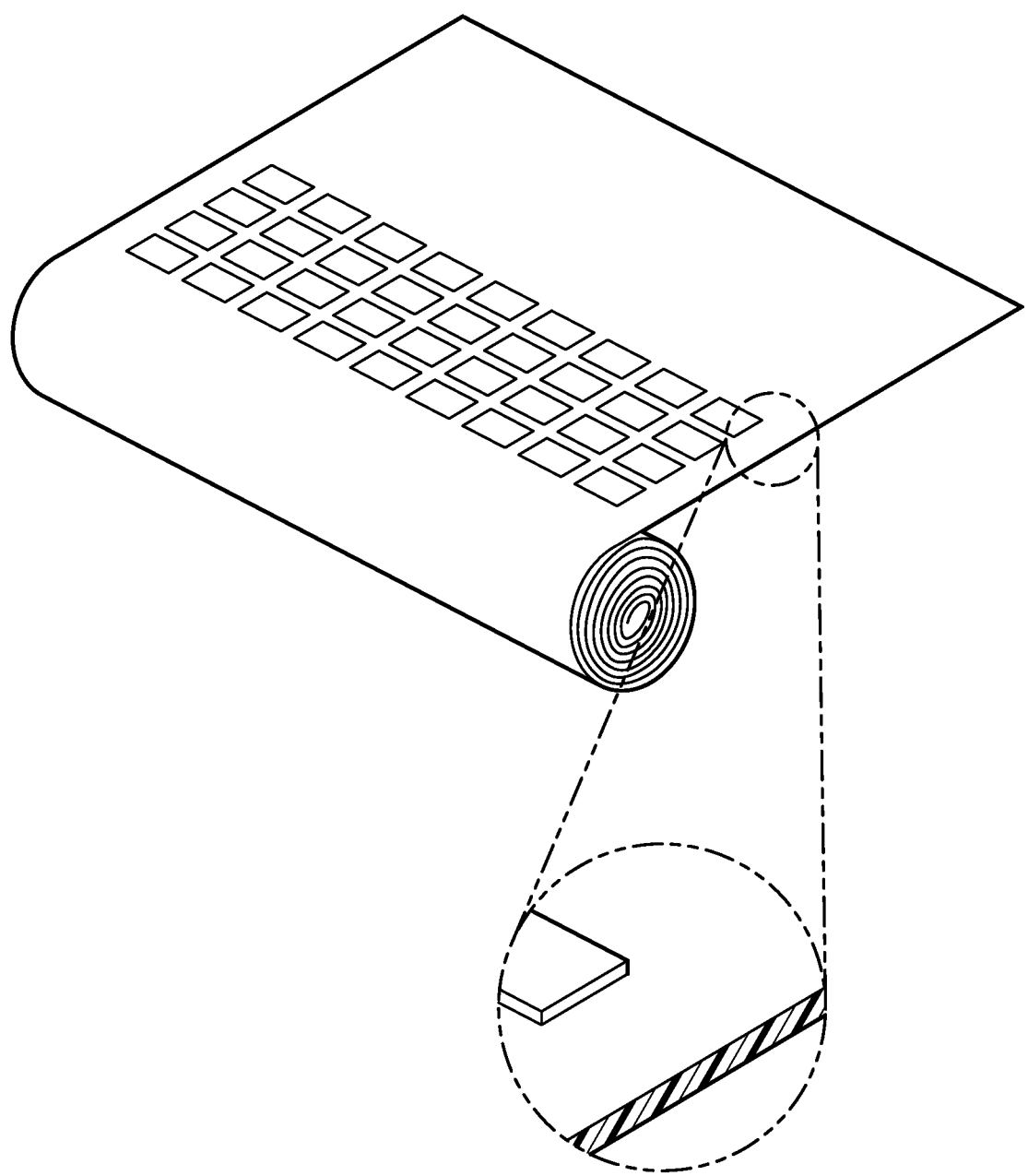
FIG. 5 an enlarged perspective view of the flexible airfoil skin mounted on the first mandrel disposed in a wing segment according to examples of the present disclosure.

FIG. 5 an enlarged perspective view of the movable skin section mounted on the first spindle disposed in a wing segment according to the present disclosure. The movable skin section may comprise a flexible sheet or flexible support member. Along a portion of the flexible sheet transducer elements, e.g. solar cells are provided, whereas along a second portion of the flexible sheet, no such transducer elements or different transducer elements are provided.

In some embodiments, the transducer elements may be solar cells. The array of solar cells may include III-V compound semiconductor solar cells.

The solar cells may have electrical contacts of positive and negative polarity on the backsides of the solar cells, and have a thickness of less than 0.03 inches. In some embodiments, a plurality of solar cells are disposed closely adjacent to one another on each of the strips by a distance between 5 and 25 microns. In some embodiments, each of the solar cells are rectangular or square and have a dimension in the range of 0.5 to 10 mm on a side.

The flexible support member may be a fiber reinforced composite material including e.g. glass fibers, Kevlar® fibres, carbon fibers or combinations of these.

Figure 6:
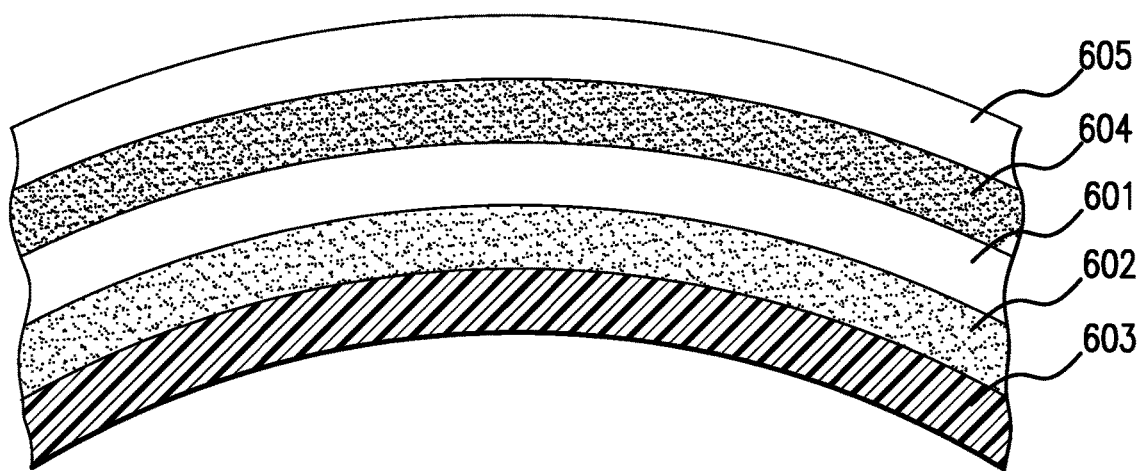
FIG. 6 a cross-sectional view of the flexible airfoil skin incorporating a layer of solar cells according to the present disclosure.

FIG. 6 a cross-sectional view of the flexible airfoil skin incorporating a layer of solar cells according to the present disclosure. As may be seen in FIG. 6, where the solar cells are provided, a multi-layer construction may be used.

In the example of FIG. 6, a flexible support member 603 may be formed by a fiber reinforced composite. This fiber reinforced composite may be e.g. a layer of para-aramid composite material which may be between 0.001 and 0.020 inches in thickness. In some examples, the flexible support member may be a polyimide film layer such as KAPTON. KAPTON® is a trademark of E.I. du Pont de Nemours and Company. The chemical name for KAPTON® is poly (4, 4'-oxydiphenylene-pyromellitimide). Other polyimide film sheets or layers may be used.

Layer 601 includes solar cells, such as e.g. III-V compound semiconductor solar cells. The solar cells may be attached to the flexible support member 603 using e.g. a pressure sensitive adhesive film 602. The film 602 may be a non-crosslinked silicon pressure sensitive adhesive.

In some embodiments of the disclosure, the backside support is a polyimide film layer with conductive traces on which the solar cells are mounted directly or solely through a conductive bonding material layer. In some embodiments of the disclosure, the conductive traces establish serial interconnections between the solar cells.

The top layer 605 may be a film composed of ethylene tetrafluoroethylene (ETFE). The solar cells may be attached to the top layer 605 by an adhesive layer 604 which may be similar to the adhesive layer 602. By using a top layer 605 covering the solar cells the outer surface of the wing may be smooth, thus enhancing aerodynamic performance.

Figure 7A:
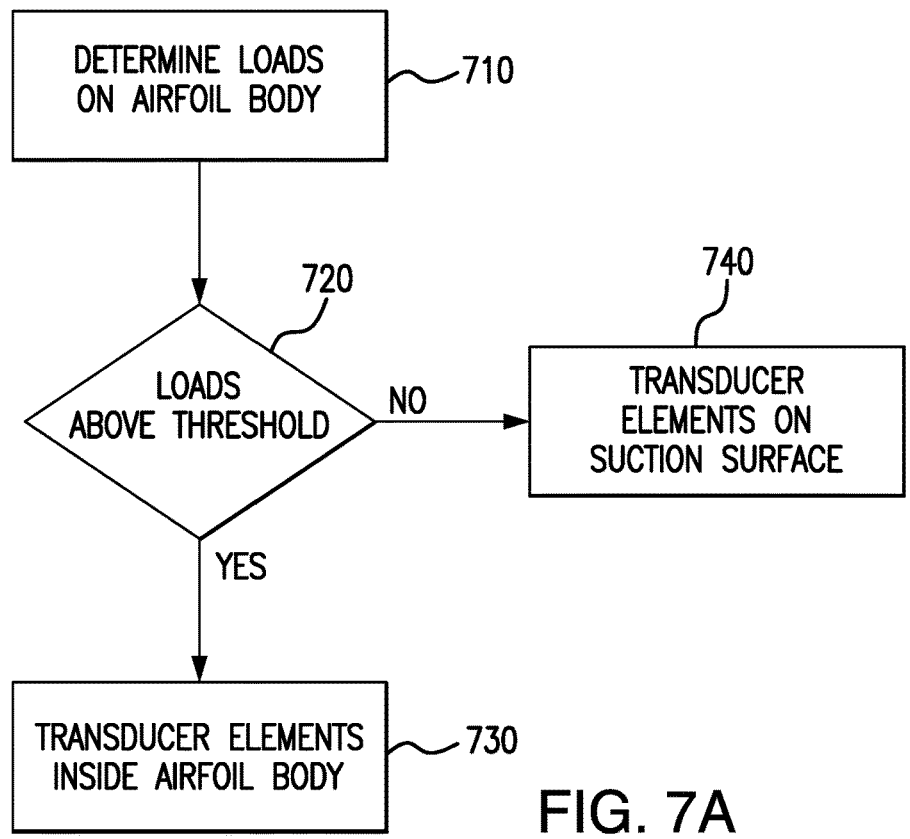
FIG. 7A is a flow chart of an example of operating a wing according to an example of the present disclosure.

FIG. 7A illustrates a flow chart of an example of a method of operating a wing. The wing may comprise an airfoil body involving a movable skin section or a flexible support member according to any of the examples hereinbefore described. At block 710, loads on the airfoil body are determined. These loads may be determined by suitable sensors. These sensors may include strain gauges on suitable locations on the wing or accelerometers. One or more of these sensors may be part of the movable skin section.

At block 720, a comparison may be made between the measured loads and one or more predetermined load thresholds. If the loads are above the corresponding threshold(s), a decision may be made at block 730 that the transducer elements should be stowed inside the airfoil body. If the transducer elements are already stowed, no action needs to be taken. If the transducer elements are exposed, e.g., positioned on the wing surface, an actuator may be activated to move the moveable skin surface so that the transducer elements are not exposed. In an example, this may include driving one or more spindles to move the moveable skin section. See FIG. 2C.

If on the other hand, the determination is made at block 740 that the loads are below corresponding load thresholds, the transducer elements may be exposed, and e.g. positioned on a surface of the wing, in particular the suction surface. If the transducer elements at that moment are retracted and stowed inside the airfoil body, the actuation mechanism may be used to position the transducer elements in the corresponding position.

Figure 7B:
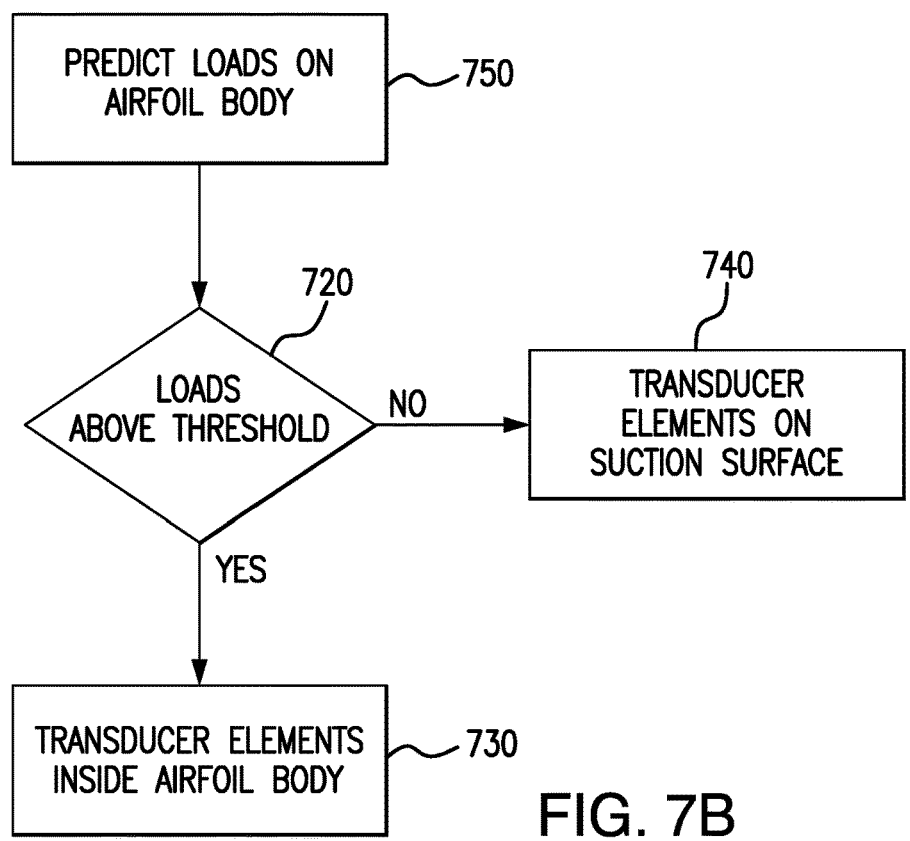
FIG. 7B is a flow chart of a further example of operating a wing according to an example of the present disclosure.

FIG. 7B shows an example of a similar method. In the example of FIG. 7B instead of determining loads on the wing may be substituted by predicting loads on the wing at block 750. A prediction of the loads may be based on a weather prediction or a flight plan, e.g. a turn of the aircraft, landing or take-off. When the loads are predicted to be higher than a predetermined threshold, the transducer elements may be stowed inside the airfoil body.

In some implementations, both the methods of FIG. 7A and FIG. 7B or aspects of these methods may be combined.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

All ranges of numerical parameters set forth in this disclosure are to be understood to encompass any and all subranges or "intermediate generalizations" subsumed therein. For example, a stated range of "1.0 to 2.0 microns" for a value of a dimension of a component such as its thickness should be considered to include any and all subranges beginning with a minimum value of 1.0 microns or more and ending with a maximum value of 2.0 microns or less, e.g., 1.0 to 1.2, 1.3 to 1.4, or 1.5 to 1.9 microns.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

In the claims, the word 'comprising' or 'having' does not exclude the presence of other elements or steps than those listed in a claims. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

Without further analysis, from the foregoing others can, by applying current knowledge, readily adapt the present invention for various applications. Such adaptations should and are intended to be comprehended within the meaning and range of equivalence of the following claims.

The invention claimed is:

1. An airfoil body for an aircraft extending from a first end to a second end, between a leading edge and a trailing edge and having a pressure surface and a suction surface, the airfoil body comprising:
    an outer surface and an inner support structure, the outer surface including a fixed skin section and a movable skin section,
    wherein the movable skin section comprises a first portion including an array of transducer elements, wherein the array of transducer elements comprises one or more of:
        (i) an array of photovoltaic devices; (ii) an array of semiconductor sensors; (iii) an antenna array; and/or (iv) piezoelectric transducers,
    the airfoil body including an actuator for moving the movable skin section to selectively position the transducer elements on the outer surface.

2. The airfoil body of claim 1, wherein the array of transducer elements includes a planar array of photovoltaic devices, and the movable skin section further comprises a second portion, the second portion being a planar region that does not include any transducer elements.

3. The airfoil body of claim 1, comprising a first spindle and a second spindle arranged within the airfoil body, wherein the movable skin section is arranged to be selectively wound around the first spindle or the second spindle, and wherein the actuator includes a first drive for rotating the first spindle.

4. The airfoil body of claim 3, wherein the actuator further includes a second drive for rotating the second spindle.

5. The airfoil body of claim 3, wherein the fixed skin section comprises a first slot and a second slot, and the movable skin section extends from the first spindle through the first slot and through the second slot to the second spindle, a portion of the movable skin section being positioned on top of the fixed skin section.

6. The airfoil body of claim 3, wherein the movable skin section extends from the first spindle over the inner support structure to the second spindle.

7. The airfoil body of claim 1, wherein a length of the first portion of the movable skin section is at least 40% of a chord line of the airfoil body.

8. The airfoil body of claim 1, wherein the array of transducer elements comprises an array of photovoltaic devices.

9. The airfoil body of claim 1, wherein the movable skin section includes a fiber reinforced supporting member.

10. The airfoil body of claim 9, wherein the supporting member is a para-aramid composite and the first portion of the movable skin section includes an ethylene tetrafluoroethylene (ETFE) upper layer.

11. An aircraft including an airfoil body according to claim 1.

12. An airfoil body for an aircraft extending from a first end to a second end, between a leading edge and a trailing edge and having a pressure surface and a suction surface, the airfoil body comprising:
   an outer skin and an inner support structure,
   a first spindle and a second spindle arranged within the airfoil body,
   a flexible support member extending between the first spindle and the second spindle on at least a portion of the suction surface and being arranged to be wound on the first spindle or the second spindle,
   the flexible support member carrying an array of transducers along a portion of the flexible support member, wherein the array of transducers includes photovoltaic elements, and
   an actuator for rotating the first spindle and/or the second spindle to selectively position the array of transducers between the first and second spindle.

13. An airfoil body for an aircraft extending from a first end to a second end, between a leading edge and a trailing edge and having a pressure surface and a suction surface, the airfoil body comprising:
   an outer skin and an inner support structure,
   a first spindle and a second spindle arranged within the airfoil body,
   a flexible support member extending between the first spindle and the second spindle on at least a portion of the suction surface and being arranged to be wound on the first spindle or the second spindle,
   the flexible support member carrying an array of transducers along a portion of the flexible support member, wherein the array of transducers includes piezoelectric elements to provide an adaptable airfoil cross-section, and
   an actuator for rotating the first spindle and/or the second spindle to selectively position the array of transducers between the first and second spindle.

14. A method of operating a wing for an aircraft comprising an airfoil body extending from a first end to a second end, between a leading edge and a trailing edge and having a pressure surface and a suction surface;
   the airfoil body having an outer skin and an inner support structure, the outer skin including a fixed skin section and a movable skin section,
   the movable skin section including a flexible supporting member that includes a first surface element along a first portion of the supporting member, and a second surface element different from the first surface element longitudinally arranged along a second portion of the supporting member, the method comprising:
   positioning the first surface element on the suction surface during first flight conditions, and positioning the second surface element during second flight conditions, wherein the first surface element is operable for solar energy conversion or load sensing.

15. The method of claim 14, wherein the first surface element is positioned on the suction surface during smooth flight conditions.

16. The method of claim 14, wherein the second surface element is positioned on the suction surface during turbulent flight conditions or during takeoff and landing of the aircraft, wherein the second surface element provides a smoother surface than the first surface element.

17. The method of claim 14, comprising determining loads on the airfoil body to determine flight conditions.

18. The method of claim 14, wherein the airfoil body comprises a first spindle and a second spindle, and the flexible supporting member extending between the first spindle and the second spindle, and wherein positioning the first surface element on the suction surface during first flight conditions, and positioning the second surface element during second flight conditions, includes winding the flexible supporting member on the first spindle or the second spindle.

* * * * *